United States Patent [19]

Furuyama

[11] Patent Number: 5,298,433
[45] Date of Patent: Mar. 29, 1994

[54] METHOD FOR TESTING SEMICONDUCTOR DEVICES

[75] Inventor: Tohru Furuyama, Tokyo, Japan

[73] Assignee: Kabushiki Kaisha Toshiba, Kawasaki, Japan

[21] Appl. No.: 813,511

[22] Filed: Dec. 26, 1991

[30] Foreign Application Priority Data

Dec. 27, 1990 [JP] Japan .................. 2-418780

[51] Int. Cl.$^5$ .................. H01L 27/08; G11C 7/00
[52] U.S. Cl. .................. 437/8; 148/DIG. 162; 365/201; 437/48
[58] Field of Search .................. 437/8; 357/71; 365/200–201, 202, 230; 148/DIG. 162; 257/48

[56] References Cited

U.S. PATENT DOCUMENTS

| 4,860,260 | 8/1989 | Saito et al. | 365/201 |
| 4,866,676 | 9/1989 | Crisp et al. | 365/201 |
| 4,999,813 | 3/1991 | Ohtsuka et al. | 365/201 |
| 5,131,018 | 7/1992 | McAdams et al. | 365/201 |
| 5,138,427 | 8/1992 | Furuyama | 357/75 |

Primary Examiner—Olik Chaudhuri
Assistant Examiner—Ken Horton
Attorney, Agent, or Firm—Banner, Birch, McKie & Beckett

[57] ABSTRACT

A method for manufacturing semiconductor devices according to this invention, comprises the wafer manufacturing step of forming an integrated circuit with a redundant circuit in each of a plurality of chip areas on a semiconductor wafer and also forming at least one stress testing terminal that applies a stress testing voltage or stress testing signal to the interconnections other than those for power supply in the integrated circuit for each of the chip areas or for every certain number of the chip areas, the step of, after the wafer manufacturing step, screening failures by applying a specified stress testing control signal or stress voltage to a certain number of chip areas with the stress testing terminal in contact with a contact terminal of a tester in the wafer state, the step of, after the screening step, judging whether or not the electrical characteristics of each chip area are acceptable through die sort test, the step of remedying an integrated circuit in a chip area judged to be defective in the judging step, by means of the redundant circuit, and the assembly step of, after the remedying step, separating the chip areas into individual elements and then assembling them into an integrated circuit device.

26 Claims, 5 Drawing Sheets

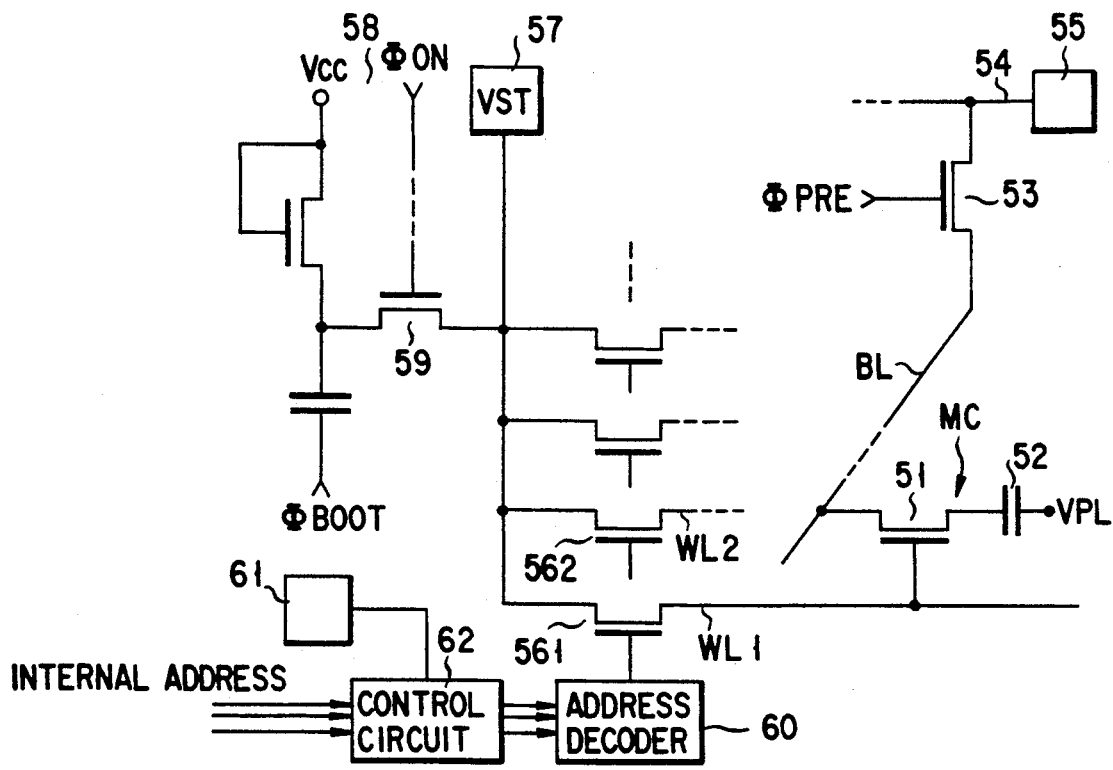
F I G. 5
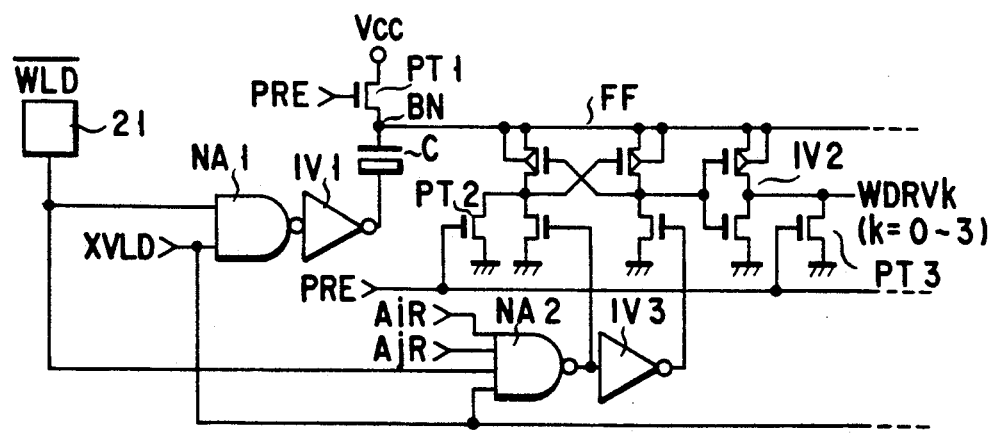
F I G. 6

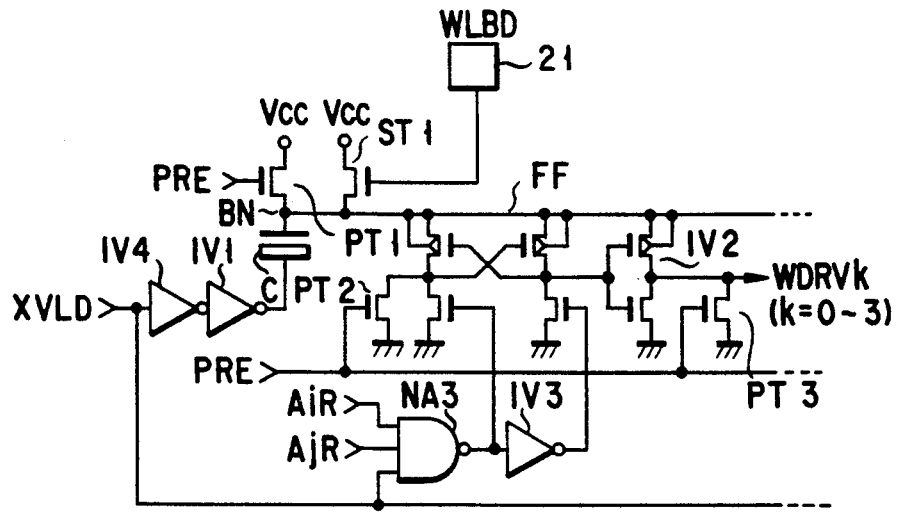
F I G. 7
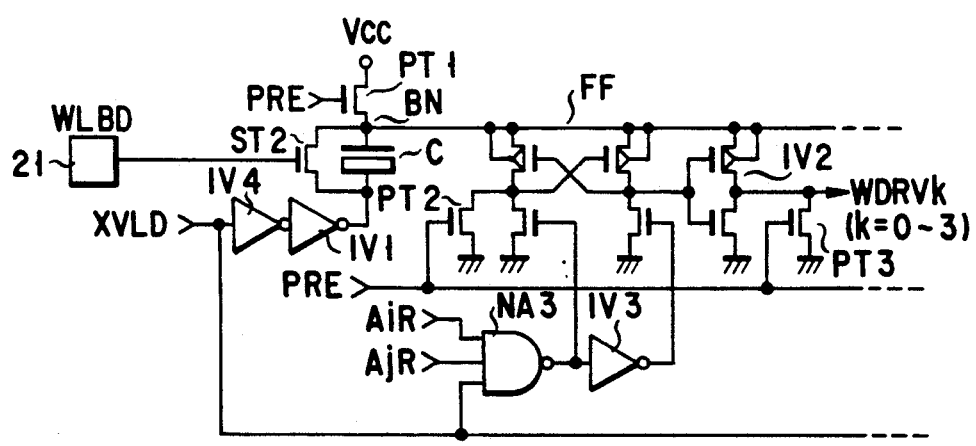
F I G. 8

METHOD FOR TESTING SEMICONDUCTOR DEVICES

BACKGROUND OF THE INVENTION

1. Field of the Invention

This invention relates to a method for manufacturing integrated circuit devices or wafer-scale integrated circuit devices, and more particularly to a method for manufacturing semiconductor devices with stress applying means for applying a more increased voltage stress than during normal operation in screening failures in the wafer state.

2. Description of the Related Art

Before the shipment of semiconductor devices, screening is generally performed to ensure their reliability in a manner that exposes and removes possible defective devices with the aim of preventing acceptable devices from unreasonably deteriorating or failing after delivery. For screening methods, burn-in that realizes the acceleration of both electric field and temperature at the same time is widely used. In the burn-in process, a device is operated at a higher voltage than its actual operating voltage at a higher temperature than its actual operating temperature to apply to the device a higher stress than that during the initial failure period of time under actual operating conditions, with an eye to screening out devices that would probably cause initial operating failures before shipment. In this way, possible initial-failure devices can be removed efficiently, thereby increasing the reliability of products.

In DRAMs of today, a raised potential (for example, in the vicinity of $1.5 \times V_{CC}$) is applied to the gate oxide film of the transfer gate (referred to as the cell transistor) of a memory cell during cell transistor selection, with the result that a severe electric field is applied to the oxide film even if it is thick. This can create a reliability problem. Therefore, in placing DRAMs under burn-in conditions, it is necessary to perform a positive screening of cell transistors whose gates are applied with a raised potential.

A conventional method used for screening of cell transistors in the burn-in process of DRAMs is to scan the addresses so as to sequentially access the word lines connected to the gates of those cell transistors. In this method, a voltage stress is applied to the cell transistors much less frequently than the transistors of the peripheral circuitry, which results in a short-time exposure of the cell transistors to the maximum electric field. Therefore, the burn-in process of such cell transistors requires a long time.

To solve the problem of applying a voltage stress to cell transistors less frequently as noted above, one of the inventors of this application has disclosed a semiconductor memory capable of improving the efficiency of applying stress to cell transistors in Published Unexamined Japanese Patent Application (Kokai) No 3-35491 which is issued to T. Furuyama and which corresponds to U.S. Pat. No. 5,258,954. In this semiconductor memory, for screening of defects, a voltage stress is simultaneously applied to all word lines or more word lines than those selected during normal operation, which is effective especially for the burn-in process in the wafer state.

In the above proposal is applied to a DRAM, defective cell transistors can considerably be reduced and 1M or 4M DRAMs having bit defects can be decreased at high speed by the screening. Therefore, the screening can be greatly improved in efficiency.

In the manufacture of EPROMs that use two-layer gate MOS transistors with a floating gate as nonvolatile memory cell transistors, the functional test includes the process of testing the charge-retaining characteristics of the floating gate of each cell transistor (the threshold voltage characteristics of cell transistors). In the test, after data (program) is written into all the cell transistors of the EPROM, voltage is applied to the gates of all those cell transistors simultaneously. This technique is disclosed in U.S. Pat. No. 4,779,272, issued to Kohda, et al. on Oct. 18, 1988 and U.K. Patent Application GB 2053611A, issued to Vernon Geroge on Feb. 4, 1981. The above functional test requires the monitoring of the properties of an EPROM, including current and voltage, and is different from the above-described burn-in process that causes the device to experience more severe stress than during the initial failure period of time under actual operating conditions.

In the manufacture of semiconductor devices with stress applying means for applying a more accelerated voltage stress than in normal operation, including the aforementioned semiconductor memories, the burn-in step in the wafer state should be added if necessary, taking into account the streamlining of the entire manufacturing process.

SUMMARY OF THE INVENTION

Accordingly, the object of the present invention is to provide a method for manufacturing semiconductor devices that enables an efficient screening of possible failures in the wafer process by screening defects in the wafer state, which brings various advantages and shortens the screening test time substantially, thereby achieving a sharp reduction in manufacturing cost.

The foregoing object is accomplished by providing a method for manufacturing semiconductor devices, comprising: a wafer manufacturing step of forming an integrated circuit with a redundant circuit in each of a plurality of chip areas on a semiconductor wafer and also forming at least one stress testing terminal that applies a stress testing voltage or stress testing signal to the interconnections other than those for power supply in the integrated circuit for each of the chip areas or for every certain number of the chip areas; a step of, after the wafer manufacturing step, screening failures by applying a specified stress testing control signal or stress voltage to a certain number of chip areas with the stress testing terminal in contact with a contact terminal of a tester in the wafer state; a step of, after the screening step, judging whether or not the electrical characteristics of each chip area are acceptable through die sort test; a step of remedying an integrated circuit in a chip area judged to be defective in the judging step, by means of the redundant circuit; and an assembly step of, after the remedying step, separating the chip areas into individual elements and then assembling them into an integrated circuit device.

The foregoing object is also accomplished by providing a method for manufacturing semiconductor devices, comprising: a wafer manufacturing step of forming on a semiconductor wafer a plurality of integrated circuit areas, at least one of which has an integrated circuit with a redundancy circuit, and also forming at least one stress testing terminal that applies a stress testing voltage or a stress testing signal to the interconnections other than those for power supply in the at least one integrated circuit area; the step of, after the wafer manufacturing step, screening failures by applying a specified stress testing control signal or stress voltage to the integrated circuit area, with a contact terminal of a tester in contact with the stress testing terminal in the wafer state; a step of, after the screening step, judging whether or not the electrical characteristics of each integrated circuit area are accepted through die sort test; a step of remedying an integrated circuit with the redundancy circuit judged to be defective in the judging step, by means of the redundancy circuit; and an assembly step of electrically connecting the remedied integrated circuit area and the accepted integrated circuit areas in the die sort test to each other on the wafer and then assembling them into a wafer-scale integrated circuit.

With such a manufacturing method of semiconductor devices, failure screening in the wafer state makes it easy to screen possible failures in the wafer process by causing the contact terminal of the probe card of a tester to make contact with the stress testing terminal in screening defects in the wafer state. Here, use of the probe card provides a highly flexible test, allowing electrical contact with a desired interconnection.

The efficiency of the voltage stress test in the wafer state can be improved remarkably by providing the integrated circuit of each chip area with a circuit that is more active and more subjected to stress than during normal operation in the finished product state when a stress testing control signal or a desired stress voltage is externally applied to the specified interconnections via the stress testing terminal.

Easy failure screening immediately after the wafer process requires no failure screening device with a huge oven, which cuts down on investment in a failure screening device, and saves installation space and testing time, thereby leading to a remarkable reduction in the manufacturing cost of integrated circuit devices.

For an integrated circuit (such as a memory) with a redundancy circuit, during failure screening in the wafer state, stress is also applied to the redundancy circuit serving as a spare circuit. The highly reliable redundancy circuit is used to replace a defective circuit, if any, to avoid the rejection of the entire circuit.

Therefore, compared with the fact that conventionally it was impossible to remedy products found defective in the failure screening after assembly, with the present invention, an improved chip yield can be expected, the reject rate after assembly can be reduced substantially, and a considerable cost reduction can be achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 5 through 9 are partial circuit diagrams for modifications of the DRAM of FIG. 2, respectively;

DETAILED DESCRIPTION OF THE PREFERRED EMBODIMENTS

Figure 1:
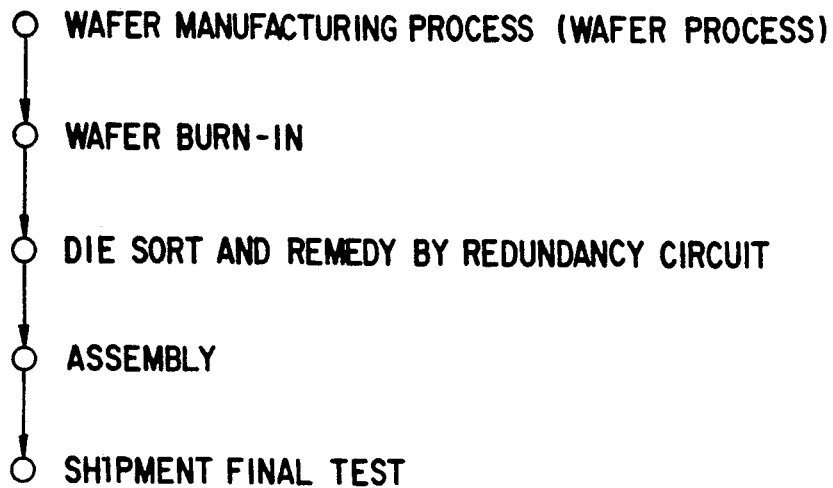
FIG. 1 is a flowchart of the steps in a method of manufacturing semiconductor devices according to a first embodiment of the present invention.

Referring to the accompanying drawings, embodiments of the present invention will be explained. Like parts are shown by corresponding reference characters throughout the views involved, and a repetitive explanation will be omitted.

FIG. 1 is a flowchart for the manufacturing processes of DRAMs according to a first embodiment of the present invention.

In the wafer manufacturing process (the wafer process), DRAM circuits each having a redundancy circuit are formed in a plurality of chip areas on a semiconductor wafer. At the same time, formed in each chip area is at least one stress testing pad that applies a stress testing voltage or stress testing signal to the interconnections other than those for power supply in the DRAM circuit.

Figure 2:
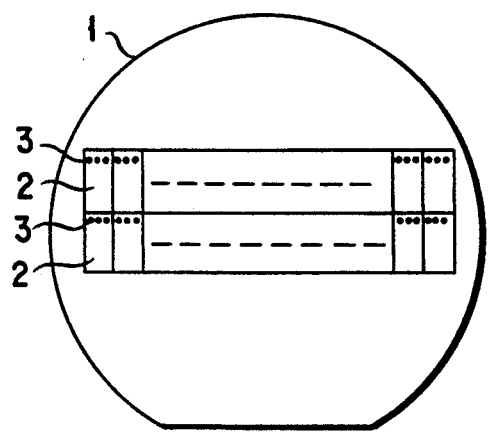
FIG. 2 is a plan view showing a portion of the chip area of a semiconductor wafer produced in the wafer process of FIG. 1 as well as the arrangement of stress testing pads.

FIG. 2 is a plan view showing portions of the chip areas 2 of a semiconductor wafer 1 formed in the wafer process and the arrangement of stress testing pads 3. The stress testing pads 3 are arranged in a row along one side of the chip areas 2 so that the needles of a probe card, during the burn-in process explained later, may be easily allowed to come into contact with the pads 3 of the chip areas 2 at the same time.

After the wafer process, with the semiconductor wafer as it is, the burn-in process is carried out by causing the contact terminals of a tester (for example, the needles of a probe card) to make contact with the stress testing pads in a certain number of chip areas and then applying a specified stress testing control signal or stress voltage to those chip areas.

After this, die sort test is performed on each chip area to determine whether or not the electrical characteristics of each chip area are acceptable.

When any chip area is found defective in the above process, this defective circuit (for example, a defective row of a memory cell array of the DRAM circuit) is replaced with the redundancy circuit in the chip area to avoid rejection.

Then, the individual chip areas on the wafer are segmented into DRAM chips.

Next, each DRAM chip is fabricated into an integrated circuit device, which is in turn subjected to the final shipment test. Examples of such an integrated circuit device include a plastic molded one in which a DRAM chip is bonded onto a lead frame, a plastic molded one by TAB techniques, and a COB (Chip On Board) assembled by directly mounting a plurality of chips on a board.

With a semiconductor wafer fixed onto a table (stage) of the tester heated (for example, at 125° C.), the burn-in process is performed using a probe card for high temperature use. In this case, if there are ten rows of chips on the wafer, two rows of which are applied with a voltage stress simultaneously, and the time required to apply stress to each chip is approximately five minutes, then the time required to process one wafer will be 5×10/2=25 minutes, which is an acceptable level for mass production. A probe card capable of simultaneously touching many rows of chips will achieve a further improved efficiency, thereby remarkable reducing the time required to process a wafer.

During the burn-in process in the wafer state, to apply stress through contact with the pads on the wafer, the contact terminals of the probe card are not necessarily to be metal needles. They may be of other materials as long as they have a construction and material (conductive rubber) that enable nondestructive contact with the pads. In this case, there is no problem if minor scratches are left on the stress testing pads due to contact with the probe card. Flaws in the pads used in both normal and burn-in operations may be allowed to the extent that they are reusable.

In addition, the burn-in process may be carried out using a probe card for low temperature use, with the semiconductor wafer fastened onto a cooled table of the tester.

The efficiency of the voltage stress test in the wafer state can be improved substantially by forming in the DRAM circuit of each chip area such a circuit as is more active or more subjected to stress than during normal operation in the finished product state when a stress testing control signal or desired stress voltage is externally applied to the specified interconnections via the stress testing pads.

Namely, as disclosed in the above U.S. Pat. No. 5,258,954 the stress testing pads are part of the voltage stress applying means provided for simultaneously applying a voltage stress to all word lines or more word lines than those selected in normal operation during the burn-in process in the wafer state.

Figure 3:
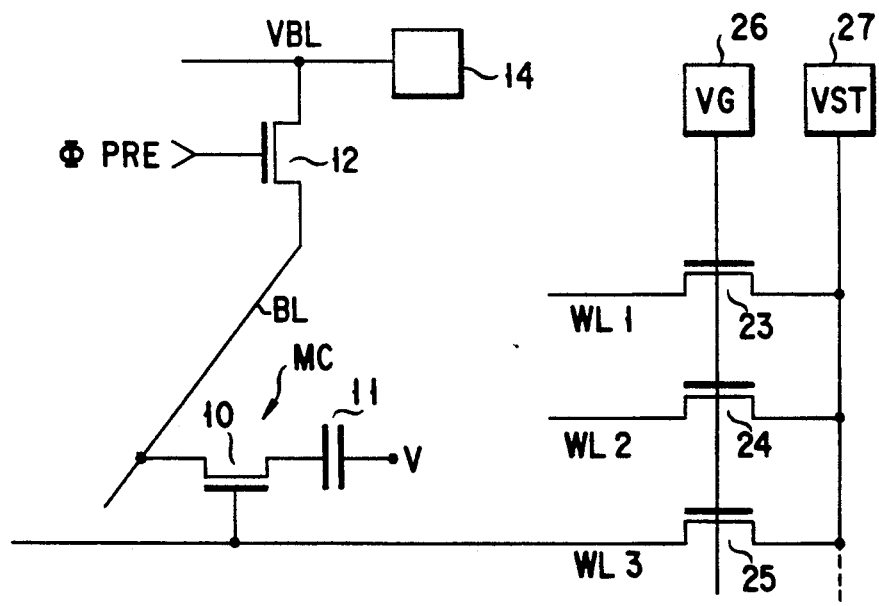
FIG. 3 is a circuit diagram for a portion of a DRAM formed in the chip area of FIG. 2.

FIG. 3 is a circuit diagram for a portion of the DRAM chip area (including the voltage stress applying means).

MC indicates a plurality of memory cells arranged in matrix (only one shown), 10 a memory cell of a MOS transistor, 11 a capacitor of the memory cell, BL bit lines (only one shown), 12 a bit-line precharging MOS transistor, 13 a bit line precharging power line, ΦPRE a precharging signal, 14 a first pad connected to the bit-line precharging power line 13, and WL1, WL2, WL3 word lines. During normal operation, the word lines WL1, WL2, WL3 are selectively controlled by the word select signal obtained by decoding the address signal. The other ends of the word lines WL1, WL2, WL3 are connected to the drains of the MOS transistors 23, 24, 25. The gates of the MOS transistors 23, 24, 25 are connected to each other and to a second pad 26 that is not used in normal operation. The sources of the MOS transistors 23, 24, 25 are also connected to one another and to a third pad 27 that is not used in normal operation. The pads 14, 26, 27 are provided separately from the power supply pad and are not used in normal operation.

In the burn-in process of the FIG. 3 DRAM, a stress voltage $V_{ST}$ is applied to the third pad 27 with the circuits other than the word lines in the inactive state. The second pad 26 is applied with a gate control voltage $V_G$ higher than $V_{ST}+V_{TH}$ (the threshold voltage of MOS transistors 23 through 25). Turning on the MOS transistors 23, 24, 25 causes a desired voltage stress to be applied to all word lines WL1, WL2, WL3.

With the manufacturing method of DRAMs a shown in FIG. 1, allowing the contact terminals of the tester's probe card to touch the stress testing pads in the failure screening procedure makes it easy to screen defects in the wafer state to remove possible failures in the wafer process. In this case, use of the probe card makes possible a highly flexible test, allowing electrical contact with desired interconnections.

Because the DRAM circuit in each chip area is provided with a circuit that is more active or undergoes stress more efficiently than during normal operation in the finished product state when a stress test control signal or desired stress voltage is externally applied to the specified interconnections via the stress testing pads, this substantially improves the efficiency of the voltage stress test in the wafer state.

Such easy screening of failures immediately after the wafer process of DRAMs eliminates the need for a failure screening device with a huge oven, which was conventionally used for the burn-in process of packaged DRAMs in the finished product state. This saves investment in a failure screening device, installation place, and test time, which leads to a remarkable reduction in the manufacturing cost of DRAMs. A new burn-in device that applies electrical and thermal stress in the wafer state is, of course, necessary, but it is much simpler and more compact than conventional burn-in devices, resulting in space savings.

Because during failure screening in the wafer state, it is possible to apply stress even to spare circuits provided as redundancy circuits, if a defective circuit occurs, it may be replaced with the highly reliable spare circuit to avoid rejection.

Compared with the fact that conventionally it was impossible to remedy failures after failure screening of the finished products, in this embodiment, however, it is possible to expect an increase in the chip yield, a remarkable reduction in the reject rate after assembly, and a substantial cost reduction. Furthermore, the reliability of DRAMs is assured for use in various types of semiconductor devices.

If necessary, additional steps may be added to the procedures in FIG. 1. For example, aside from the die sort test, another die sort (pre-die sort) step of selecting chips to which a voltage stress is to be applied under burn-in conditions may be added before the burn-in process in the wafer state (immediately after the end of the wafer process).

While the chips themselves undergo the burn-in process in the wafer state as described in FIG. 1, there may be a case where stress of some kind (for example, long-time exposure to high temperature) is applied in the package state after assembly to remove failures in the step of assembling parts into an integrated circuit device. Applying stress for failure screening in the assembly process may be replaced with performing the conventional burn-in process for a short time. In the case of circuits that has a low reject rate and allows short-time screening (for example, in DRAMs, the peripheral circuits other than memory cells), the burn-in process of chips may be performed in the package state, not in the wafer state, as was conventionally done.

Figure 4:
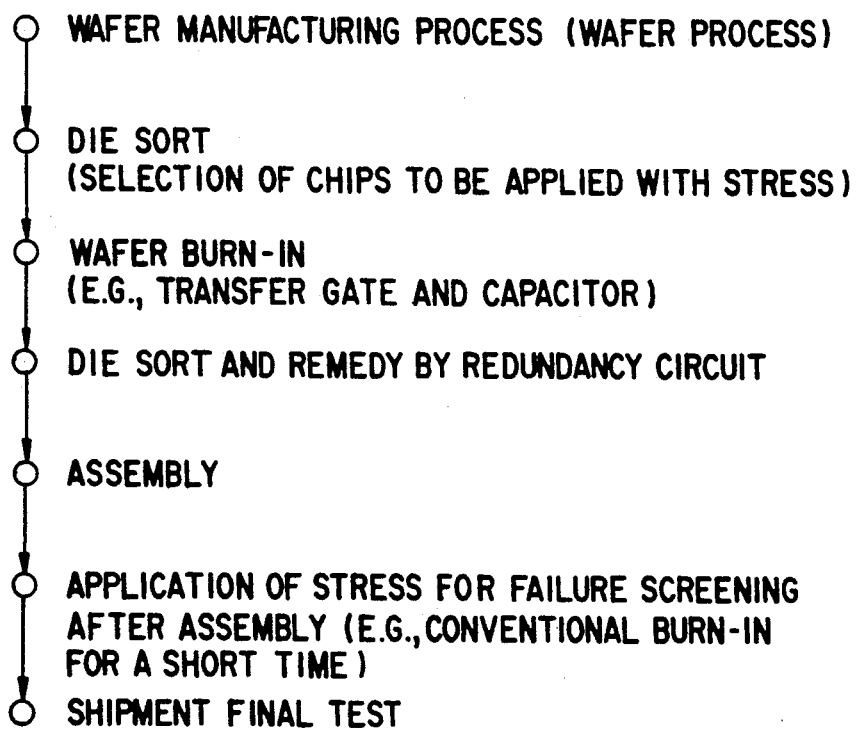
FIG. 4 is a flowchart of the steps in a method of manufacturing semiconductor devices according to a second embodiment of the present invention.

FIG. 4 is a flowchart showing the steps in a method of manufacturing DRAMs according to a second embodiment of the present invention. In this embodiment, the failure screening is performed at the time when the pre-die sort step and the step of screening failures in the assembly process.

A circuit suitable for voltage stress applying means that increases the efficiency of applying a voltage stress to the chip areas is not limited to the circuit of FIG. 3. It may be a circuit disclosed in the above U.S. Pat. No. 5,258,954 or in above U.S. patent application Ser. No. 07/219,948 issued to one of the inventors of this application, or circuits in some of the embodiments explained later.

FIG. 5 is a circuit diagram for a portion of the DRAM circuit disclosed in the above U.S. Pat. No. 5,258,954.

MC indicates a plurality of memory cells arranged in matrix (only one shown), 51 a memory cell of a MOS transistor, 52 a capacitor of the memory cell, BL bit lines (only one shown), 53 a bit-line precharging MOS transistor, 54 a bit-line precharging power line, 55 a first pad connected to the bit-line precharging power line 54, WL1, WL2, word lines, 561, 562, word-line driving MOS transistors which are connected at one end to the word lines WL1, WL2, respectively, and are connected to each other at the other end, and the gates of which are supplied with address decode signals, respectively, 57 a second pad connected in common to all the other ends of the word-line driving MOS transistors 561, 562, the pad being not in use in normal operation, 58 a word-line potential step-up circuit, 59 a transfer gate MOS transistor connected between the word-line potential step-up circuit 58 and the other ends of the word-line select MOS transistors 561, 562, $V_{PL}$ a capacitor plate potential, $\Phi$PRE a precharging signal, $\Phi$BOOT a step-up signal, and $\Phi$ON a transfer gate control signal.

Numeral 60 indicates an address decoder (a word-line select circuit), 61 a third pad that is not used in normal operation. A control circuit 62 receives internal address signals Add and /Add and a signal from the third pad 61 and supplies the internal address signal as it is to the address decoder 60 when the signal from the third pad 61 is at the inactive level (in normal operation), while supplying a signal of a constant level to the address decoder 60 irrespective of the internal address signal when the signal from the third pad 61 is at the active level (during the burn-in process in the wafer state).

In the burn-in process of the DRAM of FIG. 5 in the wafer state, an operating power is supplied from the contact terminals of the probe card of the tester across the power pad (not shown) of the DRAM chip area and the ground pad (not shown). The transfer gate MOS transistor 59 is brought in the off state to electrically separate the word lines from the word-line step-up circuit 58. With the third pad 61 applied with a stress testing signal, the control circuit 62 supplies a constant signal to the address decoder 60. The output signal from the address decoder 60 causes all the word-line driving MOS transistors 561, 562, to turn on. In this state, a desired stress voltage $V_{ST}$ is externally applied to the second pad 57 in an alternating or direct current manner. This makes it possible to drive all the word lines via the word-line select MOS transistors 561, 562. With the bit-line precharging MOS transistor 53 in the on state, externally applying a voltage such as the ground potential $V_{SS}$ to the first pad 55 makes it possible to apply a desired voltage stress between the word lines and the bit lines, or across the gate and drain of the cell transistor 51.

In contrast, when the DRAM of FIG. 5 is used in the finished product state where each DRAM has been segmented from the wafer, neither the stress testing voltage nor other signals are applied to the first to third pads 55, 57, and 61. With the transfer gate MOS transistor 59 in the on state, the control circuit 62 supplies the internal address signal as it is to the address decoder 60. This selectively turns on the word-line select MOS transistors 561, 562, according to the address decode signal.

FIGS. 6, 7, and 8 are circuit diagrams for the DRAM circuits disclosed in the above U.S. patent application Ser. No. 07/219,948. Those DRAM circuits have a step-up circuit that steps up the power supply voltage input during normal operation in the finished product state and supplies the stepped-up output only to some circuits. They also have a control circuit that decreases the potential of the stepped-up output from the step-up circuit, makes the potential equal to that before the step-up, or stop the step-up operation when the stress testing control signal is externally supplied to the specified interconnections via the stress testing pads. With this configuration, it is possible to increase the efficiency of applying stress to the remaining circuits to which the stepped-up output is not supplied, compared with that in normal operation in the finished product state.

In the DRAM circuit of FIG. 6, NA1 indicates a two-input NAND circuit, IV1 through IV3 a first through third inverters, C a MOS step-up capacitor, PT1 through PT3 a first through third precharging transistors composed of n-channel MOS transistors, NA2 a four-input NAND circuit, and FF a CMOS flip-flop circuit. Numeral 21 indicates a special pad to which a word-line disable control signal /WLD is externally supplied.

Now, the operation of the circuit of FIG. 6 will be explained. When the precharging signal PRE goes to the inactive state (the low level in this case), the precharging transistors PT1 through PT3 will all turn off, which will determine the address signals AiR and AjR, bringing the word-line activating control signal XVLD into the active state (the high level in this case).

In normal operation, with the word-line disable control signal /WLD in the inactive state (the high level in this case), when the address signals AiR and AjR are determined and the word-line activating control signal XVLD becomes active, the outputs of the four-input NAND circuit NA2 and third inverter IV3 will be determined and the output of the first inverter IV1 will go to the high level, which will permit a stepped-up voltage higher than the power supply potential $V_{CC}$ to appear at the step-up node BN. Receiving power from the stepped-up voltage, the flip-flop circuit FF and second inverter IV2 operate, with the result that the second inverter IV2 supplies the stepped-up word-line driving signal WDRVk to the word lines.

In contrast, during screening operation, the word-line disable control signal /WLD goes to the active state (the low level in this case), which brings the output of the first inverter IV1 into the low level, with the result that the step-up node BN is at the power supply potential $V_{CC}$. Receiving power from the power supply potential $V_{CC}$, the flip-flop FF and second inverter IV2 operate. Here, with the output of the four-input NAND circuit NA2 in the high level, the output of the flip-flop circuit FF (or the input of the second inverter IV2) goes to the high level, which puts the output of the second inverter IV2 (or the word-line driving signal WDRVk) in the low level, resulting in a state that does not allow word-line selection.

The FIG. 7 circuit differs from the FIG. 6 circuit in that a fourth inverter IV4 receiving the word-line activating control signal XVLD is used in place of the two-input NAND circuit NA1, a three-input NAND circuit NA3 receiving the word-line activating control signal XVLD and address signals AiR and AjR are employed instead of the four-input NAND circuit NA2, and a switching transistor ST1 composed of an n-channel MOS transistor is connected across the $V_{CC}$ node and step-up node BN, with the gate of the switching transistor ST1 supplied with the word-line boost disable control signal WLBD.

Now, the operation of the FIG. 7 circuit will be described. First, when the precharging signal PRE goes to the low level, the precharging transistors PT1 through PT3 will all turn off, which will determine the address signals AiR and AjR, bringing the word-line activating control signal XVLD into the high level. In normal operation, with the word-line boost disable control signal WLBD in the inactive state (the low level in this case), which puts the switching transistor ST1 in the off state, when the address signals AiR and AjR are determined and the word-line activating control signal XVLD becomes active, the outputs of the three-input NAND circuit NA3 and third inverter IV3 will be determined and the output of the first inverter IV1 will go to the high level, which will permit a stepped-up voltage higher than the power supply potential $V_{CC}$ to appear at the step-up node BN. Receiving power from the stepped-up voltage, the flip-flop circuit FF and second inverter IV2 operate. In contrast to this, during screening operation, the word-line boost disable control signal WLBD goes to the active state (in this case, a level higher than $V_{CC}+V_{th}$ where $V_{th}$ is the threshold voltage of the switching transistor ST1), which turns on the switching transistor ST1. Because this fixes the potential of the step-up node BN to the power supply potential $V_{CC}$, even when the output of the first inverter IV1 goes to the high level, all the charges will flow back to the power supply potential $V_{CC}$. Receiving power from the power supply potential $V_{CC}$, the flip-flop FF and second inverter IV2 operate. Here, according to the outputs of the three-input NAND circuit NA3 and third inverter IV3, the flip-flop circuit FF is driven and the output of flip-flop circuit FF is inverted at the second inverter IV2 to drive the word lines.

The FIG. 8 circuit is different from the FIG. 7 circuit in that a switching transistor ST2 made up of an n-channel MOS transistor is connected in parallel with the step-up capacitor C instead of the switching transistor ST1, with the gate of the switching transistor ST2 supplied with the word-line boost disable control signal WLBD.

The circuit of FIG. 8 operates almost the same manner as the circuit of FIG. 7.

Figure 9:
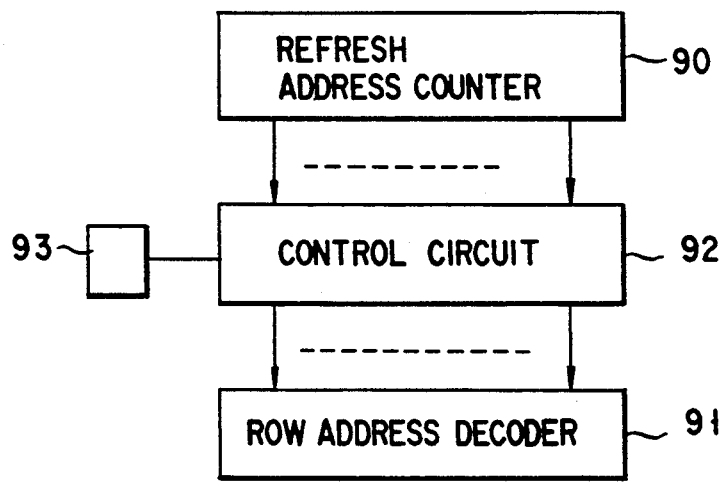

The DRAM circuit of FIG. 9 has a refreshing address counter 90 and is designed so that during the burn-in procedure, the word lines of the memory cell array may be more active than in the refreshing action during normal operation in the finished product state.

Connected between the output of the address counter 90 and the row address decoder 91 is a control circuit 92, to which the stress testing pads 93 is connected. The control circuit 92 is designed so that, receiving the control signal from the stress testing pad 93 during the burn-in process in the wafer state, it may activate more word lines of the memory cell array than those activated by the row address decoder 91 in the refreshing action in normal operation in the finished product state.

In the case of semiconductor devices with interconnections selectively activated by the scanning signal, the stress testing pad is connected to the interconnections to which all of or more than the interconnections selectively activated by the scanning signal during normal operation in the finished product state are directly or indirectly connected in common. With this configuration, externally applying a desired stress voltage to the stress testing pad allows the circuit to operate more actively than during normal operation in the finished product state.

In the embodiment, the stress testing pad may be a bonding pad. It may take another form as long as it has contact terminals of a tester used for burn-in in the wafer state, such as terminals designed to make contact with the probe card. Its material may be conductive rubber and its shape a bump used in, for example, TAB (Tape Automated Bonding) techniques.

While in the embodiment, each DRAM area is provided with a stress testing pad, a stress testing pad may be provided for every certain number of DRAM chip areas on the wafer for common use by those DRAM areas and the interconnections to connect the pads to the specified interconnections in the DRAM chip areas may be formed on the semiconductor wafer, for example, on the dicing lines. In this case, however, because it is impossible to form on the dicing lines marks or the like required for mask alignment in the conventional manufacturing processes, proper measures must be taken to avoid this problem.

To form screening wires in any place, there is a technique in which a screening interconnection layer is formed via an insulting film on the wafer and connected to the pad, and after the screening process in the wafer state, the screening interconnection layer and insulating film are removed. However, this technique involves a much increased number of wafer processes and is not practical.

Although in the embodiment, the present invention is applied to the manufacture of DRAM chips, it may also be applicable to chips in other types of memories such as SRAMs, ROMs, EPROMs, or EEPROMs.

The present invention may be applied to the manufacture of memory-incorporated chips containing memory circuits, such as embedded memories in which a DRAM circuit is built in the logic circuit or CPU (Central Processing Unit). Here, before screening in the wafer state, the DRAM circuit is electrically separated from the logic circuit and CPU so that the DRAM circuit can be subjected to the burn-in process under the best stress conditions. Applying the optimum stress to both the logic circuit and CPU as well as the DRAM circuit simultaneously or with some time lag allows screening in the wafer state.

Furthermore, the present invention may be applied to wafer-scale integrated circuit devices that have a plurality of integrated circuit areas (block areas) to be connected to each other on the semiconductor wafer for final products, as described in "200-Mb Wafer Memory," ISSCC 89, Digest of Tech. Paper, pp. 240-241.

Referring to FIG. 1, a manufacturing method of wafer-scale semiconductor devices according to an embodiment of the present invention will be explained, particularly in a case where a portion of the integrated circuit area of the wafer-scale semiconductor device contains a DRAM area.

In the wafer manufacturing process (the wafer process), on the semiconductor wafer, a plurality of integrated circuit areas are formed, at least one of which has a DRAM circuit containing a redundant circuit. Also formed on the wafer is at least one stress testing pad that applies a stress testing voltage or stress testing signal to the interconnections other than those for power supply in the at least one DRAM area.

Then, the burn-in process is performed by causing the contact terminals of the probe card of the tester to make contact with the stress testing pad in the wafer state to apply a specified stress testing control signal or stress voltage to the integrated circuit areas.

Next, die sort test is performed to judge whether or not the electrical characteristics of each integrated circuit area are acceptable. In this process, when a DRAM circuit with a redundant circuit is judged to be defective, it is remedied using the redundant circuit. After the remedied DRAM area and the acceptable integrated circuit areas are electrically connected to each other on the wafer, they are assembled into a wafer-scale integrated circuit and proceeds to the shipment final test.

With the above-described manufacturing method of wafer-scale integrated circuit devices, because the reliability of each component on the wafer is guaranteed in advance, wafer-scale integrated circuit devices free from not only initial failures but also reliability defects are realized.

The present invention may be applied not only to the manufacture of semiconductor devices where integrated circuits are formed on the semiconductor substrate but also to the manufacture of semiconductor devices where integrated circuits are formed on the semiconductor layer formed on the insulating substrate (for example, SOI: Silicon on Insulator).

Figure 10:
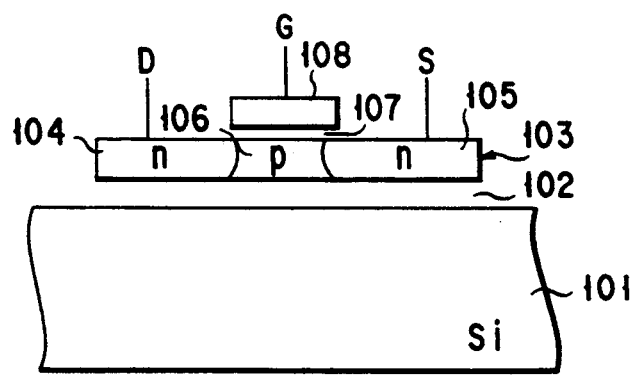
FIG. 10 is a sectional view for a portion of an SOI semiconductor device to which the present invention is applicable.

FIG. 10 is a sectional view for a portion of an SOI semiconductor device. Numeral 101 indicates a silicon substrate, 102 an insulating layer formed on the substrate, 103 a semiconductor layer formed on the insulating layer. In the semiconductor layer 103, the n-type drain region 104, n-type source region 105, and p-channel region 106 of an n-channel MOS transistor are formed. Numeral 107 indicates a gate insulating film formed on the semiconductor layer, and 108 a gate electrode formed on the gate insulating film.

While in each embodiment described above, the present invention is applied to a voltage stress test in the burn-in process, it may be, of course, applicable to a voltage stress test that is performed without temperature acceleration.

The embodiments described herein referring to the accompanying drawings are illustrative and not restrictive. Accordingly, various modifications may be made without departing from the spirit or scope of the general inventive concept as defined by the appended claims and their equivalents.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. A method for manufacturing semiconductor devices, comprising:

a wafer manufacturing step of forming an integrated circuit with a redundant circuit and a power supply terminal in each of a plurality of chip areas on a semiconductor wafer and also forming at least one stress testing terminal that applies a stress testing voltage or stress testing signal to the interconnections other than those for power supply in said integrated circuit for each of the chip areas;

a step of, after the wafer manufacturing step, screening failures by applying a specified stress testing control signal or stress voltage to a certain number of chip areas with said stress testing terminal in contact with a contact terminal of a tester in the wafer state;

a step of, after the screening step, judging whether or not the electrical characteristics of each chip area are acceptable through test;

a step of remedying an integrated circuit in a chip area judged to be defective in the judging step, by means of said redundant circuit; and an assembly step of, after the remedying step, separating said chip areas into individual elements and then assembling them into an integrated circuit device.

2. A method for manufacturing semiconductor devices according to claim 1, further comprising a step of selecting chips to which a voltage stress is to be applied for failure screening, this step being located between said wafer manufacturing step and failure screening step.

3. A method for manufacturing semiconductor devices according to claim 1, further comprising a step of screening failures caused in said assembly step in the package state after assembly.

4. A method for manufacturing semiconductor devices according to claim 2, further comprising a step of screening failures caused in said assembly step, in the package state after assembly.

5. A method for manufacturing semiconductor devices according to any one of claims 1 to 4, wherein said integrated circuit is a memory circuit having a memory cell and a cell peripheral circuit, and performs said screening of failures in said memory cell and the screening of failures in said cell peripheral circuit in the package state after said assembly step.

6. A method for manufacturing semiconductor devices according to any one of claims 1 to 4, wherein said integrated circuit contains a circuit designed so as to be more active or more subjected to stress than during normal operation in the finished product state when said interconnections are externally applied with the stress testing control signal or stress voltage via said stress testing terminals.

7. A method for manufacturing semiconductor devices according to any one of claims 1 to 4, wherein said specified interconnections are directly or indirectly connected in common to all of or more than the interconnections selectively activated during normal operation in the finished product state, and are externally applied with a desired stress voltage via said stress testing terminal.

8. A method for manufacturing semiconductor devices according to claim 7, wherein said interconnections selectively activated during normal operation are interconnections selectively activated by the signal decoded from the address signal or by the scanning signal.

9. A method for manufacturing semiconductor devices according to claim 8, wherein said chip area is a memory chip area or a memory-incorporated chip area containing a memory circuit, and said interconnections connected in common to said specified interconnections are the word lines and/or bit lines of the memory cell array in said integrated circuit area.

10. A method for manufacturing semiconductor devices according to any one of claims 1 to 4, wherein said chip area contains a step-up circuit that steps up the power supply voltage input and supplies the stepped-up output only to some of the circuits during normal operation in the finished product state, and a control circuit that causes said step-up circuit to reduce the potential of the stepped-up output, make it equal to the potential before the step-up, or stop the step-up operation when said specified interconnections are externally applied with the stress testing control signal via said stress testing terminal.

11. A method for manufacturing semiconductor devices according to claim 10, wherein said chip area is a dynamic memory chips area or a memory-incorporated chip area containing a dynamic memory circuit, and said step-up circuit is a word-line voltage step-up circuit.

12. A method for manufacturing semiconductor devices according to any one of claims 1 to 4, wherein said chip area is a memory chip area or a memory incorporated chip area containing a memory circuit, which has a refresh address counter and a control circuit that controls said address counter so that the word lines of the memory cell array may be more active than in a refreshing action during normal operation in the finished product state when said interconnections are externally applied with the stress testing control signal via said stress testing terminal.

13. A method for manufacturing semiconductor devices according to any one of claims 1 to 4, wherein a certain number of said stress testing terminals are provided for each of said chip areas, in such a manner that they concentrate almost along one side of the chip area.

14. A method for manufacturing semiconductor devices according to any one of claims 1 to 4, wherein said semiconductor wafer is a semiconductor substrate or a substrate in which a semiconductor layer is formed on an insulating layer.

15. A method for manufacturing semiconductor devices, comprising:
a wafer manufacturing step of forming an integrated circuit with a redundant circuit and a power supply terminal in each of a plurality of chip areas on a semiconductor wafer and also forming a stress testing terminal that applies a stress testing voltage or stress testing signal to interconnections other than those for power supply in said integrated circuit for every certain number of said chip areas;
a step of, after the wafer manufacturing step, screening failures by applying a specified stress testing control signal or stress voltage to a certain number of chip areas with said stress testing terminal in contact with a terminal of a tester in the wafer state;
a step of, after the screening step, judging whether or not the electrical characteristics of each chip area are acceptable through a test;
a step of remedying an integrated circuit in a chip area judged to be defective in the judging step, by means of said redundant circuit; and
an assembly step of, after the remedying step, separating said chip areas into individual elements and then assembling them into an integrated circuit.

16. The method for manufacturing semiconductor devices according to claim 15, further comprising a pre-die sort step of selecting chips to which a voltage stress is to be applied for failure screening, the pre-die sort step occurring between the wafer manufacturing step and the failure screening step.

17. The method for manufacturing semiconductor devices according to claim 15, further comprising a step of screening failures caused in the assembly step in the package state after assembly.

18. The method for manufacturing devices according to claim 16, further comprising a step of screening failures caused in the assembly step in the package state after assembly.

19. The method for manufacturing semiconductor devices according to any one of claims 15-18, wherein said integrated circuit is a memory circuit having a memory cell and a cell peripheral circuit, and performs the screening of failures in said memory cell and the screening of failures in said cell peripheral circuit in the package stage after the assembly step.

20. The method for manufacturing semiconductor devices according to any one of claims 15-18, wherein said integrated circuit contains a circuit designed so as to be more active or more subjected to stress than during normal operation in the finished product state when said interconnections are externally applied with the stress testing control signal or stress voltage via said stress testing terminals.

21. The method for manufacturing semiconductor devices according to any one of claims 15-18, wherein said specified interconnections are directly or indirectly connected in common to all or more than the interconnections selectively activated during normal operation in the finished product state, and are externally applied with a desired stress voltage via said stress testing terminal.

22. The method for manufacturing semiconductor devices according to claim 21, wherein said interconnections selectively activated during normal operation are interconnections selectively activated by a signal decoded from an address signal or by a scanning signal.

23. The method for manufacturing semiconductor devices according to claim 22, wherein said chip area is a memory chip area or a memory-incorporated chip area containing a memory circuit, and said interconnections connected in common to said specified interconnections are word lines and/or bit lines of the memory cell array in said integrated circuit area.

24. The method for manufacturing semiconductor devices according to any one of claims 15-18, wherein said chip area contains a step-up circuit that steps up the power supply voltage input and supplies the stepped-up output only to some of the circuits during normal operation in the finished product state, and a control circuit that causes said step-up circuit to reduce the potential of the stepped-up output, make it equal to the potential before the step-up, or stop the step-up operation when said specified interconnections are externally applied with the stress testing control signal via said stress testing terminal.

25. The method for manufacturing semiconductor devices according to claim 24, wherein said chip area is a dynamic memory chip area or a memory-incorporated chip area containing a dynamic memory circuit, and said step-up circuit is a word line voltage step-up circuit.

26. The method of manufacturing semiconductor devices according to any one of claims 15-18, wherein said chip area is a memory chip area or a memory-incorporated chip area containing a memory circuit, which has a refresh address counter and a control circuit that controls said address counter so that the word lines of the memory cell array may be more active than in a refreshing action during normal operation in the finished product state when said interconnections are externally applied with the stress testing control signal via said stress testing terminal.

* * * * *